United States Patent
Alpert et al.

(10) Patent No.: US 8,826,215 B1
(45) Date of Patent: Sep. 2, 2014

(54) ROUTING CENTRIC DESIGN CLOSURE

(71) Applicant: International Business Machines Corporation, Armonk, NY (US)

(72) Inventors: Charles J. Alpert, Austin, TX (US); Zhuo Li, Cedar Park, TX (US); Gi-Joon Nam, Austin, TX (US); Chin Ngai Sze, Austin, TX (US); Paul G. Villarrubia, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/902,751

(22) Filed: May 24, 2013

(51) Int. Cl.
*G06F 17/50* (2006.01)

(52) U.S. Cl.
USPC ........... 716/126; 716/108; 716/113; 716/114; 716/119

(58) Field of Classification Search
CPC ............ G06F 17/5068; G06F 17/5072; G06F 17/5077; G06F 2217/84
USPC .................. 716/108, 113, 114, 119, 126, 134
See application file for complete search history.

(56) References Cited

U.S. PATENT DOCUMENTS

| | | | |
|---|---|---|---|
| 5,784,289 A * | 7/1998 | Wang | 716/122 |
| 6,701,504 B2 | 3/2004 | Chang et al. | |
| 6,725,438 B2 | 4/2004 | van Ginneken | |
| 7,730,437 B1 | 6/2010 | Ramakrishnan et al. | |
| 7,814,451 B2 | 10/2010 | Furnish et al. | |
| 7,971,174 B1 | 6/2011 | Khalsa et al. | |
| 7,992,122 B1 | 8/2011 | Burstein et al. | |
| 7,996,797 B1 | 8/2011 | Singh et al. | |
| 8,024,693 B2 | 9/2011 | Adams et al. | |
| 8,032,855 B1 | 10/2011 | Ling et al. | |
| 2008/0216038 A1 | 9/2008 | Bose | |
| 2008/0216040 A1 * | 9/2008 | Furnish et al. | 716/10 |
| 2009/0063564 A1 | 3/2009 | Lahner et al. | |
| 2009/0254874 A1 * | 10/2009 | Bose | 716/6 |
| 2009/0271752 A1 * | 10/2009 | Alpert et al. | 716/9 |
| 2011/0055784 A1 | 3/2011 | Gao et al. | |
| 2011/0320992 A1 | 12/2011 | Alpert et al. | |

* cited by examiner

*Primary Examiner* — Jack Chiang
*Assistant Examiner* — Brian Ngo
(74) *Attorney, Agent, or Firm* — Law Offices of Ira D. Blecker, P.C.

(57) ABSTRACT

Method of placing and routing circuit components including: dividing a layout area of an integrated circuit (IC) design into an array of tiles, each tile having a plurality of edges that are common to adjoining tiles; placing of circuit components into the layout area of the IC design such that each tile including a plurality of circuit components, the placing of circuit components being performed for primarily routability without resort to a timing model, routability being measured by congestion of wiring nets at the tile edges; performing a virtual timing operation of the IC design with a virtual timing model assuming ideal buffering is done to test the placement of circuit components; performing a wire synthesis operation of the IC design for layer assignment, buffering and timing optimization while minimizing degradation in routability; and performing a plurality of timing optimizations of the IC design while minimizing degradation in routability.

18 Claims, 3 Drawing Sheets

ROUTING CENTRIC DESIGN CLOSURE

BACKGROUND

The exemplary embodiments relate to electronic design automation and, more particularly, relate to routing nets of an integrated circuit design with an emphasis on routability.

Advances in semiconductor technology presently make it possible to integrate hundreds of millions of transistors onto a single semiconductor chip. This dramatic increase in semiconductor integration densities has made it considerably more challenging to efficiently design circuits.

Specifically, routing a circuit design involves determining routes for metal wires which electrically connect circuit elements to produce routed circuits that perform desired functions. Routing wires of a large circuit design can take several days using conventional routing techniques. Moreover, traditional timing design closure may create a design which closes timing with Steiner models, but has large timing degradation post routing.

Physical synthesis is prominent in the automated design of integrated circuits such as high performance processors and application specific integrated circuits (ASICs). Physical synthesis is the process of concurrently optimizing placement, routing, timing, power consumption, crosstalk effects and the like in an integrated circuit design. This comprehensive approach helps to eliminate iterations between circuit analysis and place-and-route. Physical synthesis has the ability to resize gates (changing their gate sizes and power levels), insert repeaters (buffers or inverters), clone gates or other combinational logic, etc., so the area of logic in the design remains fluid. However, physical synthesis can take days to complete.

Routability is a key factor when performing circuit floorplanning or trying to close on timing via physical synthesis. A designer can expend considerable effort trying to get the design into a good state in terms of timing and signal integrity, only to subsequently find that it is unroutable. Ideally, the designer should be able to invoke a snapshot routability analysis that allows him or her to understand the routability issues involved from making floorplanning or optimization decisions.

BRIEF SUMMARY

The various advantages and purposes of the exemplary embodiments as described above and hereafter are achieved by providing, according to a first aspect of the exemplary embodiments, a method of placing and routing circuit components including: dividing a layout area of an integrated circuit (IC) design into an array of tiles, each tile having a plurality of edges that are common to adjoining tiles; placing of circuit components into the layout area of the IC design such that each tile including a plurality of circuit components, the placing of circuit components being performed for primarily routability without resort to a timing model, routability being measured by congestion of wiring nets at the tile edges; performing a virtual timing operation of the IC design with a virtual timing model assuming ideal buffering is done to test the placement of circuit components; performing a wire synthesis operation of the IC design for layer assignment, buffering and timing optimization while minimizing degradation in routability; and performing a plurality of timing optimizations of the IC design while not degrading congestion while minimizing degradation in routability, wherein the placing of circuit components starts good routability and the following timing optimization steps maintain the good routability. The method may be performed by one or more computing devices.

According to a second aspect of the exemplary embodiments, there is provided a computer program product for placing and routing circuit components, the computer program product including a non-transitory computer readable storage medium having computer readable program code embodied therewith. The computer readable program code includes: computer readable program code configured to divide a layout area of an integrated circuit (IC) design into an array of tiles, each tile having a plurality of edges that are common to adjoining tiles; computer readable program code configured to place circuit components into the layout area of the IC design such that each tile including a plurality of circuit components, the placement of circuit components being performed for primarily routability without resort to a timing model, routability being measured by congestion of wiring nets at the tile edges; computer readable program code configured to perform a virtual timing operation of the IC design with a virtual timing model assuming ideal buffering is done to test the placement of circuit components; computer readable program code configured to perform a wire synthesis operation of the IC design for layer assignment, buffering and timing optimization while minimizing degradation in routability; and computer readable program code configured to perform a plurality of timing optimizations of the IC design while minimizing degradation in routability, and wherein the computer readable program code configured to place circuit components starts good routability and the following timing optimization steps maintain the good routability.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION

Routing is typically performed in two stages known as global routing and detailed routing. In global routing, the circuit design area is partitioned into a grid of rectangles referred to variously as bins, buckets, global cells (g-cells), or tiles (referred to hereafter as tiles). Each of the tiles may contain circuit components (not shown) such as transistor gates which may be wired together within each of the tiles. Some of the wiring may go from tile to tile. Each of the boundaries between adjacent tiles is a global edge, and each global edge has wiring tracks used in assigning global interconnections, that is, connections between tiles without consideration of connections or pins inside a tile. Wiring congestion at a given edge is defined as the routing demand divided by the available track capacity, or as the difference between capacity and demand.

Figure 1:
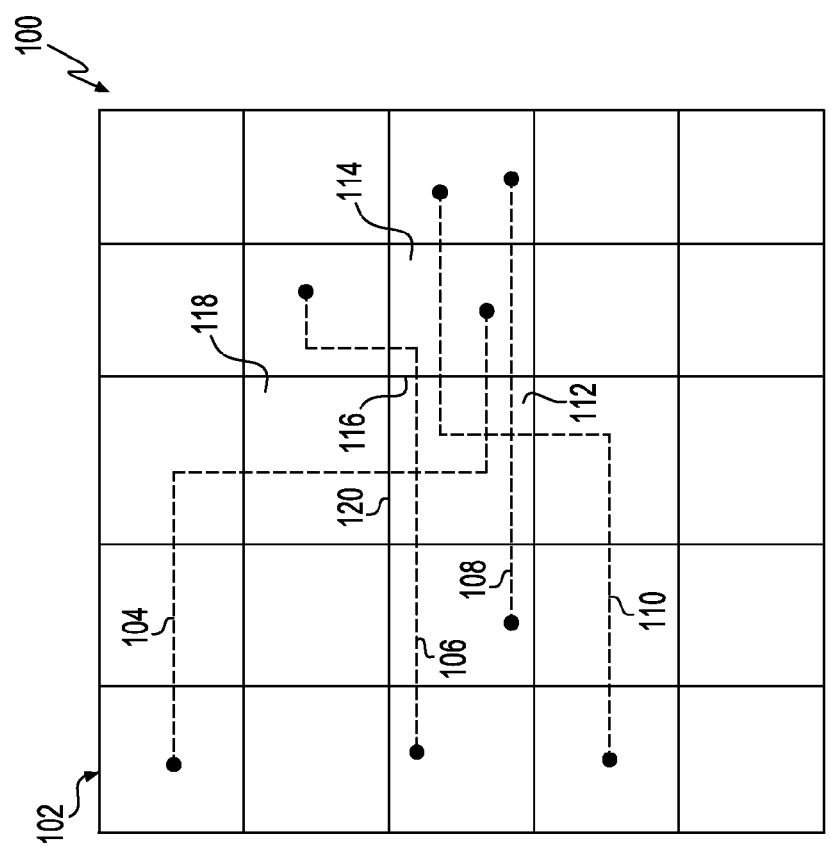
FIG. 1 is an integrated circuit design being divided into tiles illustrating edge congestion in the global routing model.

FIG. 1 illustrates an integrated circuit design 100 comprising 25 tiles 102. For purposes of illustration, integrated circuit design 100 contains 4 wiring nets 104, 106, 108, 110, all of which pass through tile 112 and tile 114. In actuality there will typically be many more such wiring nets. Tile 112 and tile 114 have a common vertical edge 116. In a similar manner, tile 112 and tile 118 have a common horizontal edge 120 through which one wiring net passes.

Congestion looks at the number of wiring segments that may pass over the tile edges. A vertical edge measures horizontal congestion, and a horizontal edge measures vertical congestion. In this example, if it is assumed that there are five possible wiring tracks at each horizontal and vertical edge of tile 112, four of those wiring tracks have been assigned at vertical edge 116 and one of those wiring tracks have been assigned at horizontal edge 120. The resulting edge congestion is accordingly 4/5=80% at vertical edge 116 and 1/5=20% at horizontal edge 120.

Congestion may be used as a measure of whether a circuit design is routable or not. If two connections are proximate but there are no wiring tracks available at a tile edge, the wiring net connecting those two connections may be unroutable because of the congestion at the tile edge. If there are more wiring nets at a tile edge than can be accommodated by the available number of wiring tracks, an overflow situation exists and some wiring nets have to be rerouted.

There is proposed in the exemplary embodiments a routing centric design closure flow for a semiconductor chip. Each optimization transform is measured in a physical synthesis based on its routing and timing impact and then ordered in a manner that is good for both routability and timing closure. Some of these optimization transforms are global placement, timing driven placement, detailed placement, placement mitigation for global and detail congestion, logic restructuring, buffer insertion, layer assignment, gate sizing and threshold voltage optimization. For most optimization transforms other than buffering and placement, timing can be fixed with small impact on routing. Most of the placement changes, layer assignment and buffer insertion has a large impact on routability and may be performed earlier in the flow.

Usually, if a transform affects gates in a small local region, a smaller impact on global routing congestion would be expected. For example, detailed placement, gate sizing, threshold voltage optimization, localized gate displacement and logic restructuring are considered to have small impact on global routing congestion. However, layer assignment and buffer insertion, global placement, large scale logic synthesis are considered to have a large impact.

The exemplary embodiments first will measure the congestion and timing cost of each optimization/placement transform and will order all existing transforms based on its routability and timing impact. The transform that has large routability impact (i.e., most disruptive to routability) should be performed earlier in the flow and the transform with small impact on routability (i.e., less disruptive to routability) should be performed later in the flow so as to have a smoother flow. In addition, for a particular transform, there may be parameters to control the optimization magnitude in terms of cell movement distance and disruption to routability. According to the exemplary embodiments, the transforms with the parameters creating large scale change may be invoked at an early stage of the flow and the transforms with the parameters creating small scale change may be invoked at a later stage of the design closure.

The exemplary embodiments solve two key problems, namely, that timing optimization degrades routing congestion and congestion reduction hinders timing optimization.

Existing techniques try to do post timing routing congestion fix-up (i.e., congestion mitigation) but these techniques have a huge impact on timing, and another iteration on timing is needed which leads to another round of congestion fix-up which may continue through additional iterations. The turn-around time of existing congestion-fixup/timing-recovery approaches is very bad and disruptive.

Figure 2:
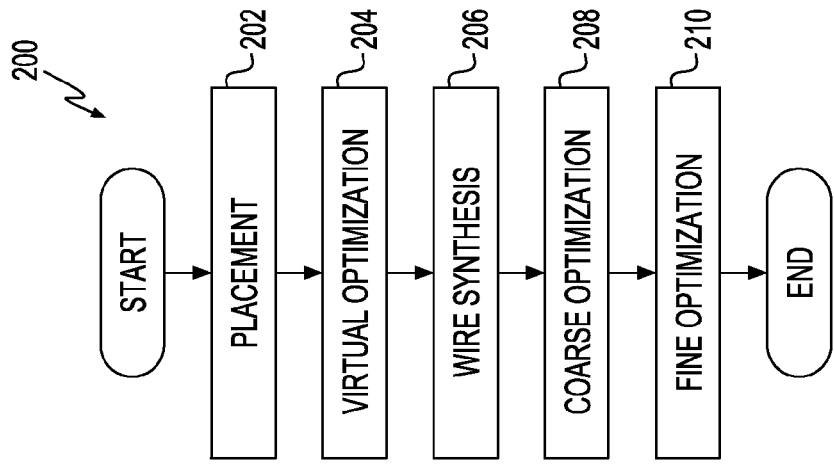
FIG. 2 is a flow chart illustrating a process according to the exemplary embodiments.

The exemplary embodiments employ a routing centric flow in which the most disruptive global placements are done first without regard to timing considerations. Referring now to FIG. 2, there is illustrated a routing centric flow 200 comprising placement 202, virtual optimization 204, wire synthesis 206, coarse timing optimization 208 and fine timing optimization 210.

In the routing centric flow 200, congestion may be monitored by running a congestion analysis engine at the end of each step of 202, 204, 206, 208, 210. The congestion analysis engine may be a global router, a subset of a full global router, or congestion estimation tool by probabilistic routing model, to name a few as examples. A congestion analysis engine may be run during each step of 202, 204, 206, 208, 210 in order to drive optimization decisions. In addition to, or as an alternative to, running the congestion analysis engine at the end of each step of 202, 204, 206, 208, 210, the congestion analysis engine may also run simultaneously while each step of 202, 204, 206, 208, 210 is run.

In placement 202, congestion-driven placement of circuit components is done so as to minimize congestion at tile boundaries. Placement is the portion of the physical design flow that assigns locations for various circuit components. There may also be high-fanout buffering during placement 202. Buffering is the addition of a signal repeater (sometimes an inverter) in series with the wiring segment so as to keep the signal strong. No timing optimization is done during placement 202. However, in order to achieve congestion mitigation, a lot of techniques may be applied. For example, congestion and/or routing demand modeling during core placement engine, cell spreading, and logic restructuring such as fanin/fanout logic cone re-synthesis may be applied in order to achieve as low congestion as possible.

If the congestion of "placement" step 202 indicates that the design is un-routable, the designer should rework the logic, pin assignment, or the floorplans.

The next process is virtual optimization where the circuit design is checked for timing delays using ideal buffering. That is, virtual optimization looks for the shortest route between connection point A and connection point B and checks for delays. Buffers may be inserted where necessary. The virtual optimization process includes a virtual timing model and any wiring model. A virtual timing model may be any linear delay model that calculates the delay assuming buffers or inverters are inserted into the net optimally. A preferred wiring model is one that looks to place wiring directly from connection point A to connection point B. Other wiring models that may be used include Steiner trees, global routing and detail routing. For any wiring model, we can calculate/estimate the post-buffering delay without actually inserting the buffers and inverters. The major difference between virtual optimization 204 and coarse optimization 208 and fine optimization 210 are the delay model used, and the recipe (i.e. the choices and the order) of applying different timing optimization transforms. The linear delay model used for virtual optimization may not be sufficiently accurate for coarse optimization 208 and fine optimization 210 and so the linear delay model would typically not be used for coarse optimization 208 and fine optimization 210. More accurate delay models, such as Asymptotic Waveform Evaluation (AWE) delay models, would be used for coarse optimization 208 and fine optimization 210.

If the virtual timing model indicates that the timing meets the IC design requirements, then the virtual optimization may be done and the flow may proceed to wire synthesis.

If the virtual timing model indicates that the timing does not meet the IC design requirements, the designer should rework the logic, pin assignment, or the floorplans.

Virtual optimization refers to any timing optimization based on the virtual timing model. For example, some incremental optimizations may be done to modify the placement of components. These incremental optimizations may include gate sizing, threshold voltage assignment, logic optimizations, layer assignment and cell movement. It should be understood that the most disruptive movement of components is done during placement and that the incremental optimizations contemplated by the virtual optimization process are small in comparison.

Wiring for the IC design 100 may be done in the back end of the line (BEOL) wiring layers and there may be several of the BEOL wiring layers. The BEOL wiring layers are built on the semiconductor portion of a semiconductor chip and provide wiring connections to the various semiconductor devices found on the semiconductor chip. The principal wiring will be on the BEOL wiring layers closest to the semiconductor portion but if there is too much congestion on these BEOL wiring layers, the upper layers of the BEOL wiring layers may be used for additional wiring paths. These upper layers of the BEOL wiring layers may have thicker wiring lines to reduce timing delays.

In wire synthesis 206, there may be layer assignment (in addition to any layer assignment done in wire synthesis) in which some of the wiring segments are directed to the upper wiring layers. Buffering may also be done to be consistent with good routing, i.e., routability is not degraded. The objective of wire synthesis is to fix capacitance and timing violations.

Subsequently, various timing optimizations may be done.

In coarse timing optimization 208, timing optimization is done to alleviate timing delays. There may be some incremental movement of, for example, cells or gates, to improve timing. However, the coarse timing optimization 208 should be congestion-aware such that congestion should not be degraded during timing optimization.

In fine timing optimization 210, additional timing optimization is done. Again, there may be some incremental movement of, for example, cells or gates, but this movement is less disruptive to routability than the movement in coarse timing optimization 208. Again, the fine timing optimization 210 should be congestion-aware such that congestion should not be degraded during timing optimization.

There may be additional timing optimizations performed as those skilled in the art may appreciate. These additional timing optimizations are not part of the exemplary embodiments and are not included here for clarity and conciseness.

Figure 3:
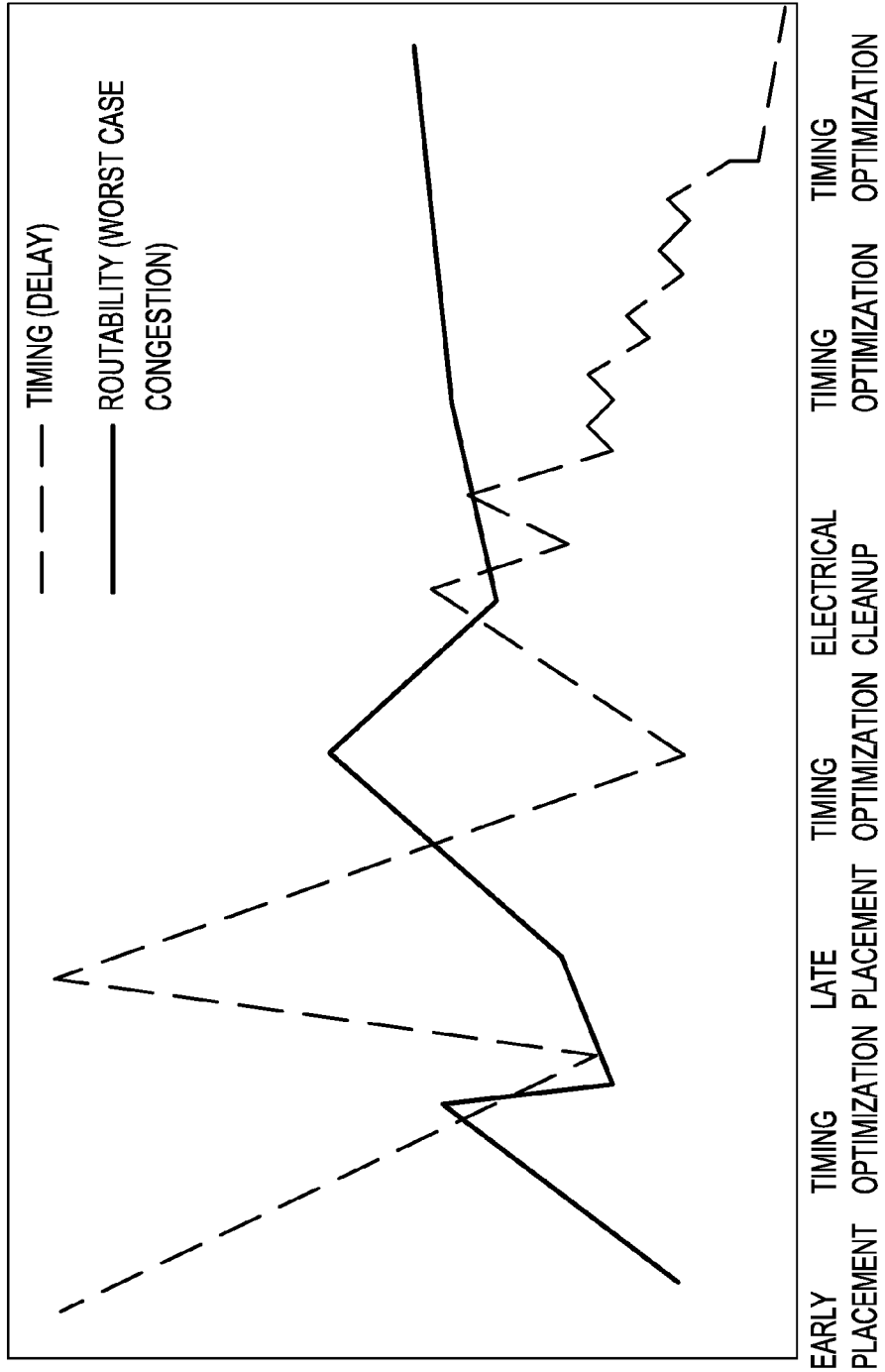
FIG. 3 is a graph illustrating timing delay and routability for a conventional process flow.

Referring now to FIG. 3, there is illustrated a graph which shows timing and routability versus each of the timing optimization and placement steps in a conventional timing and routability optimization process. The vertical axis is delay for the timing line and worst case congestion for all the tile boundaries in the IC design for the routability line. With each placement, there is a large increase in timing delay, illustrated by a peak in the timing line. Also, with each timing optimization, there is an increase in congestion, illustrated by a rise or peak in the routability line.

The conventional timing and routability flow shown in FIG. 3 demonstrates a disruptive timing closure. When you alleviate congestion (i.e., improve routability), timing delay often increases. Congestion mitigation may be an afterthought in the flow. It is noted that there may be more than one global placement process in the conventional flow.

Figure 4:
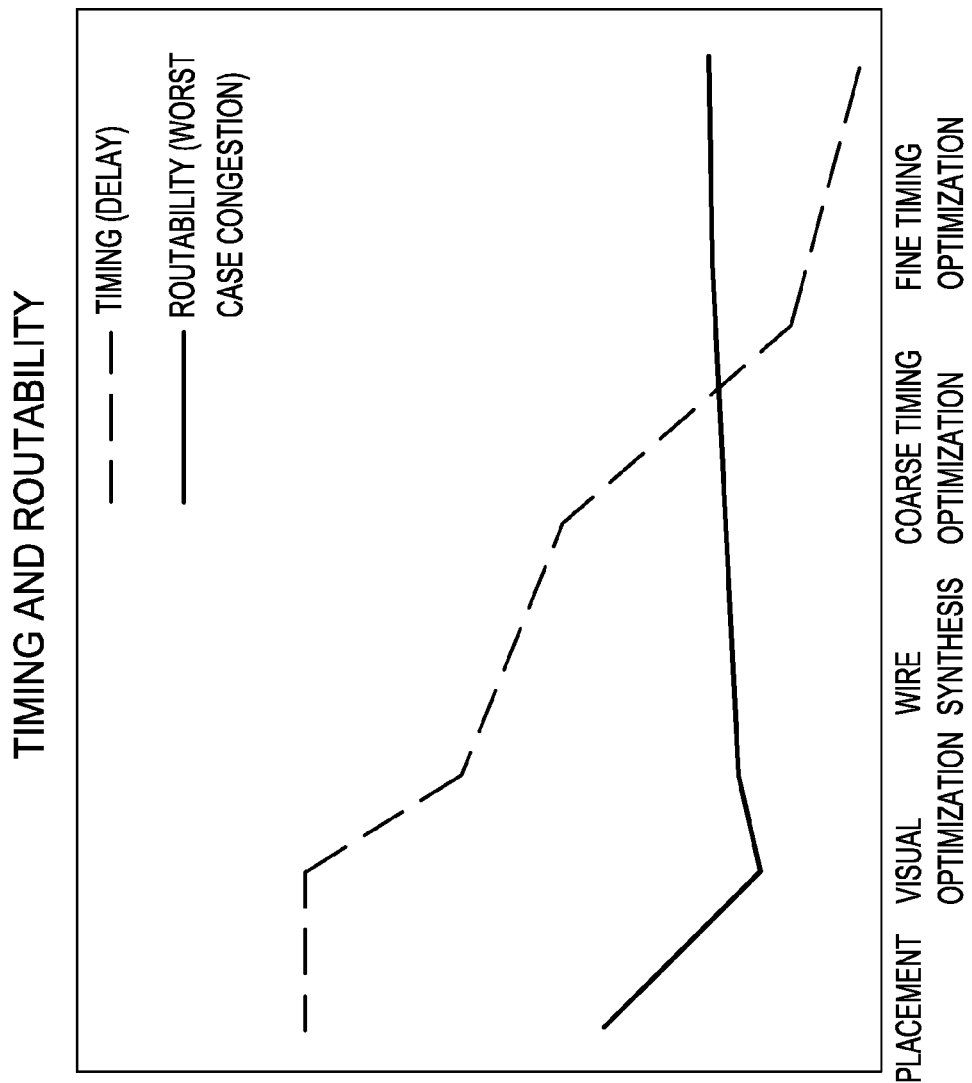
FIG. 4 is a graph illustrating timing delay and routability for a process flow according to the exemplary embodiments.

The result of the route-centric flow of the exemplary embodiments is shown in FIG. 4. The most disruptive movement of circuit components is done during the placement process with an emphasis on routability. After placement, the emphasis is on timing without degrading routability. It can be seen from FIG. 4 that a desirable result of improving timing without substantially degrading routability has been obtained. This is achieved by evaluating each optimization step (transform) based on its impact to timing and congestion, and order the transforms from the most to the least congestion disruptive. Note that this technique is general and can be applied to any existing timing optimization flow.

Figure 5:
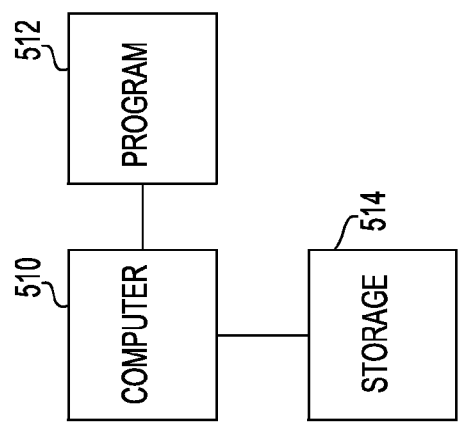
FIG. 5 is a block diagram illustrating an exemplary hardware environment for the exemplary embodiments.

The computing devices implementing the exemplary embodiments may be a general-purpose computer or a special purpose computing device such as a hand-held computer. FIG. 5 is a block diagram that illustrates one exemplary hardware environment of the computing devices. The exemplary embodiments may be implemented using a computer 510 comprised of microprocessor means, random access memory (RAM), read-only memory (ROM) and other components. The computer 510 may be a personal computer, server, mainframe computer, hand-held device or other computing device. Resident in the computer 510, or peripheral to it, may be a storage device 514 of some type such as a hard disk drive, floppy disk drive, CD-ROM drive, tape drive or other storage device.

Generally speaking, the software implementation of the exemplary embodiments, program 512 in FIG. 5, may be tangibly embodied in a computer-readable medium such as one of the storage devices 514 mentioned above. The program 512 may comprise instructions which, when read and executed by the microprocessor of the computer 510, may cause the computer 510 to perform the steps necessary to execute the steps or elements of the exemplary embodiments.

As will be appreciated by one skilled in the art, aspects of the exemplary embodiments may be embodied as a system, method, service method or computer program product. Accordingly, aspects of the exemplary embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the exemplary embodiments may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible or non-transitory medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the exemplary embodiments may be written in any combination of one or more programming languages, including an object oriented programming language such as Java, Smalltalk, C++ or the like and conventional procedural programming languages, such as the "C" programming language or similar programming languages or even Microsoft Excel/Access. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the exemplary embodiments have been described above with reference to flowchart illustrations and/or block diagrams of methods, apparatus (systems) and computer program products according to the exemplary embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and/or block diagrams in the Figures illustrate the architecture, functionality, and operation of possible implementations of systems, methods, service methods and computer program products according to the exemplary embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A method of placing and routing circuit components comprising:
    dividing a layout area of an integrated circuit (IC) design into an array of tiles, each tile having a plurality of edges that are common to adjoining tiles;
    placing of circuit components into the layout area of the IC design such that each tile including a plurality of circuit components, the placing of circuit components being performed for primarily routability without resort to a timing model, routability being measured by congestion of wiring nets at the tile edges;
    performing a virtual timing operation of the IC design with a virtual timing model assuming ideal buffering is done to test the placement of circuit components;
    performing a wire synthesis operation of the IC design for layer assignment, buffering and timing optimization while minimizing degradation in routability; and
    performing a plurality of timing optimizations of the IC design while minimizing degradation in routability;
    moving circuit components during the plurality of timing optimizations such that a disruptiveness of moving circuit components varies from more disruptive in early timing optimizations to less disruptive in later timing optimizations;
    wherein the placing of circuit components starts good routability and the following timing optimization steps maintain the good routability; and
    wherein the method is performed by one or more computing devices.

2. The method of claim 1 further comprising adding one or more buffers after one of the plurality of timing optimizations.

3. The method of claim 1 wherein the layout area includes a plurality of metallization layers for routing wires and wherein the layer assignment of the wire synthesis includes routing at least one wire from a first metallization layer to a second metallization layer to relieve congestion or reduce timing delays on the first metallization layer.

4. The method of claim 1 wherein performing a virtual timing operation includes performing a layer assignment wherein the layer assignment includes routing at least one wire from a first metallization layer to a second metallization layer to relieve congestion or reduce timing delays on the first metallization layer.

5. The method of claim 1 wherein the virtual timing model includes any linear delay model that calculates a delay between any two connection points in the IC design assuming that buffers or inverters are inserted into the IC design optimally.

6. The method of claim 1 wherein the virtual timing operation includes a wiring model in combination with the virtual timing model such that the wiring model determines the point to point wiring topology for each wiring net of the IC design and the virtual timing model calculates the post-buffering timing delay for each point to point wiring net.

7. The method of claim 1 wherein if the virtual timing operation determines that the timing of the IC design is acceptable, then the method directly proceeds to wire synthesis while when the timing of the IC design is not acceptable in virtual timing, then further comprising incrementally moving the circuit components to improve the timing of the design.

8. The method of claim 7 wherein wire synthesis includes layer assignment, buffering, gate sizing and other optimization techniques.

9. The method of claim 1 wherein the plurality of timing optimizations include gate sizing, threshold voltage assignment and optimization, logic optimizations, layer assignment and cell movement.

10. A computer program product for placing and routing circuit components, the computer program product comprising:
a non-transitory computer readable storage medium having computer readable program code embodied therewith, the computer readable program code comprising:
computer readable program code configured to divide a layout area of an integrated circuit (IC) design into an array of tiles, each tile having a plurality of edges that are common to adjoining tiles;
computer readable program code configured to place circuit components into the layout area of the IC design such that each tile including a plurality of circuit components, the placement of circuit components being performed for primarily routability without resort to a timing model, routability being measured by congestion of wiring nets at the tile edges;
computer readable program code configured to perform a virtual timing operation of the IC design with a virtual timing model assuming ideal buffering is done to test the placement of circuit components;
computer readable program code configured to perform a wire synthesis operation of the IC design for layer assignment, buffering and timing optimization while minimizing degradation in routability; and
computer readable program code configured to perform a plurality of timing optimizations of the IC design while minimizing degradation in routability;
computer readable program code configured to move circuit components during the plurality of timing optimizations such that a disruptiveness of moving circuit components varies from more disruptive in early timing optimizations to less disruptive in later timing optimizations; and
wherein the placing of circuit components starts good routability and the following timing optimization steps maintain the good routability.

11. The computer program product of claim 10 further comprising computer readable program code configured to add one or more buffers after one of the plurality of timing optimizations.

12. The computer program product of claim 10 wherein the layout area includes a plurality of metallization layers for routing wires and wherein the layer assignment of the wire synthesis includes computer readable program code configured to route at least one wire from a first metallization layer to a second metallization layer to relieve congestion or reduce timing delays on the first metallization layer.

13. The computer program product of claim 10 wherein computer readable program code configured to perform a virtual timing operation includes computer readable program code configured to perform a layer assignment wherein the layer assignment includes routing at least one wire from a first metallization layer to a second metallization layer to relieve congestion or reduce timing delays on the first metallization layer.

14. The computer program product of claim 10 wherein the virtual timing model includes any linear delay model that calculates a delay between any two connection points in the IC design assuming that buffers or inverters are inserted into the IC design optimally.

15. The computer program product of claim 10 wherein the virtual timing operation includes a wiring model in combination with the virtual timing model such that the wiring model determines the point to point wiring topology for each wiring net of the IC design and the virtual timing model calculates the post-buffering timing delay for each point to point wiring net.

16. The computer program product of claim 10 wherein when the virtual timing operation determines that the timing of the IC design is acceptable, then the computer program product directly proceeds to computer readable program code configured to perform wire synthesis while when the timing of the IC design is not acceptable in virtual timing, then further comprising computer readable program code configured to incrementally move the circuit components to improve the timing of the design.

17. The computer program product of claim 16 wherein wire synthesis includes layer assignment, buffering, gate sizing and other optimization techniques.

18. The computer program product of claim 10 wherein the plurality of timing optimizations include gate sizing, threshold voltage assignment and optimization, logic optimizations, layer assignment and cell movement.

* * * * *